United States Patent
Haug et al.

(10) Patent No.: US 11,967,933 B2
(45) Date of Patent: Apr. 23, 2024

(54) CLOCK MATCHING TUNE CIRCUIT

(71) Applicant: TEXAS INSTRUMENTS INCORPORATED, Dallas, TX (US)

(72) Inventors: Gebhard Haug, Mössingen (DE); Dirk Preikszat, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/849,484

(22) Filed: Jun. 24, 2022

(65) Prior Publication Data

US 2023/0421102 A1    Dec. 28, 2023

(51) Int. Cl.
*H04L 7/00* (2006.01)
*H03D 11/06* (2006.01)
*H03L 7/099* (2006.01)
*H04L 25/02* (2006.01)

(52) U.S. Cl.
CPC .......... *H03D 11/06* (2013.01); *H03L 7/0992* (2013.01); *H04L 7/0012* (2013.01); *H04L 25/0268* (2013.01)

(58) Field of Classification Search
CPC .............. H04L 7/0008; H04L 7/0012; H04L 7/0016–0041; H04L 25/0264–0268
See application file for complete search history.

(56) References Cited

U.S. PATENT DOCUMENTS

| | | | | |
|---|---|---|---|---|
| 10,277,278 | B2* | 4/2019 | Goswami | H04L 47/825 |
| 2008/0311862 | A1* | 12/2008 | Spina | H01Q 1/38 |
| | | | | 455/78 |
| 2010/0329364 | A1* | 12/2010 | Giombanco | H04L 7/0008 |
| | | | | 375/258 |
| 2012/0281603 | A1* | 11/2012 | Takatori | H04L 5/1423 |
| | | | | 370/286 |
| 2013/0278438 | A1* | 10/2013 | Mueck | G08C 17/06 |
| | | | | 340/870.16 |

* cited by examiner

*Primary Examiner* — Levi Gannon
(74) *Attorney, Agent, or Firm* — John R. Pessetto; Frank D. Cimino

(57) ABSTRACT

In an example, a system includes circuitry on a first side of an isolation barrier and circuitry on a second side of the isolation barrier, where the isolation barrier is operable to electrically isolate the first side from the second side. The system also includes a trimmed oscillator, a first transmitter, and a first receiver on the first side, the trimmed oscillator coupled to the first transmitter. The system includes a tunable oscillator, a second transmitter, and a second receiver on the second side, the tunable oscillator coupled to the second receiver and the second transmitter. In the system, the first side is configured to transmit a training sequence to the second side, and the second side is configured to tune the tunable oscillator based on the training sequence.

18 Claims, 6 Drawing Sheets

CLOCK MATCHING TUNE CIRCUIT

BACKGROUND

An isolator (or isolation barrier) is a device that electrically isolates one circuit from another. The two circuits being isolated may operate in different voltage domains and may have different "ground" potentials. The isolation barrier may include an opto-coupler, a capacitive bridge, an isolation transformer, galvanic isolation, etc. In general, the isolation barrier permits data to be transferred from one circuit (e.g., a, transmitter) to other circuit (e.g., a receiver) while allowing the circuits to operate in different voltage domains (with different ground potentials). Data may be transmitted across the isolation barrier by modulating the data by the "transmitting" circuit, passing the modulated signal through the isolation barrier, and then demodulating the signal by the "receiving" circuit thereby resulting in the original data. Oscillators on each side of the isolation barrier are matched to allow data transmitted across the barrier to be properly encoded and decoded. Oscillators may be matched by trimming the oscillators, for example with fuses.

SUMMARY

In accordance with at least one example of the description, a method includes transmitting a training sequence signal from a first oscillator on a first side of an isolation barrier to a receiver on a second side of the isolation barrier. The method also includes tuning a second oscillator on the second side of the isolation barrier based on the training sequence signal. The method includes, responsive to a frequency of the second oscillator reaching a predetermined range, transmitting a data signal from the second side to the first side of the isolation barrier. The method also includes, responsive to the first side successfully decoding the data signal, transmitting a data sequence to the second side.

In accordance with at least one example of the description, a system includes circuitry on a first side of an isolation barrier and circuitry on a second side of the isolation barrier, where the isolation barrier is operable to electrically isolate the first side from the second side. The system also includes a trimmed oscillator, a first transmitter, and a first receiver on the first side, the trimmed oscillator coupled to the first transmitter. The system includes a tunable oscillator, a second transmitter, and a second receiver on the second side, the tunable oscillator coupled to the second receiver and the second transmitter. In the system, the first side is configured to transmit a training sequence to the second side, and the second side is configured to tune the tunable oscillator based on the training sequence.

In accordance with at least one example of the description, a method of operating a system having circuitry on a first side of an isolation barrier and circuitry on a second side of the isolation barrier includes receiving data at the first side from the second side, where the first side includes a trimmed oscillator and the second side includes a tunable oscillator. The method also includes counting a number of faults in the data at the first side. The method includes, responsive to the number of faults reaching a predetermined threshold, transmitting a training sequence from the first side to the second side. The method also includes tuning the tunable oscillator based on the training sequence. The method includes transmitting a data signal from the second side to the first side of the isolation barrier. Responsive to the first side successfully decoding the data signal, the method includes transmitting a data sequence to the second side.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
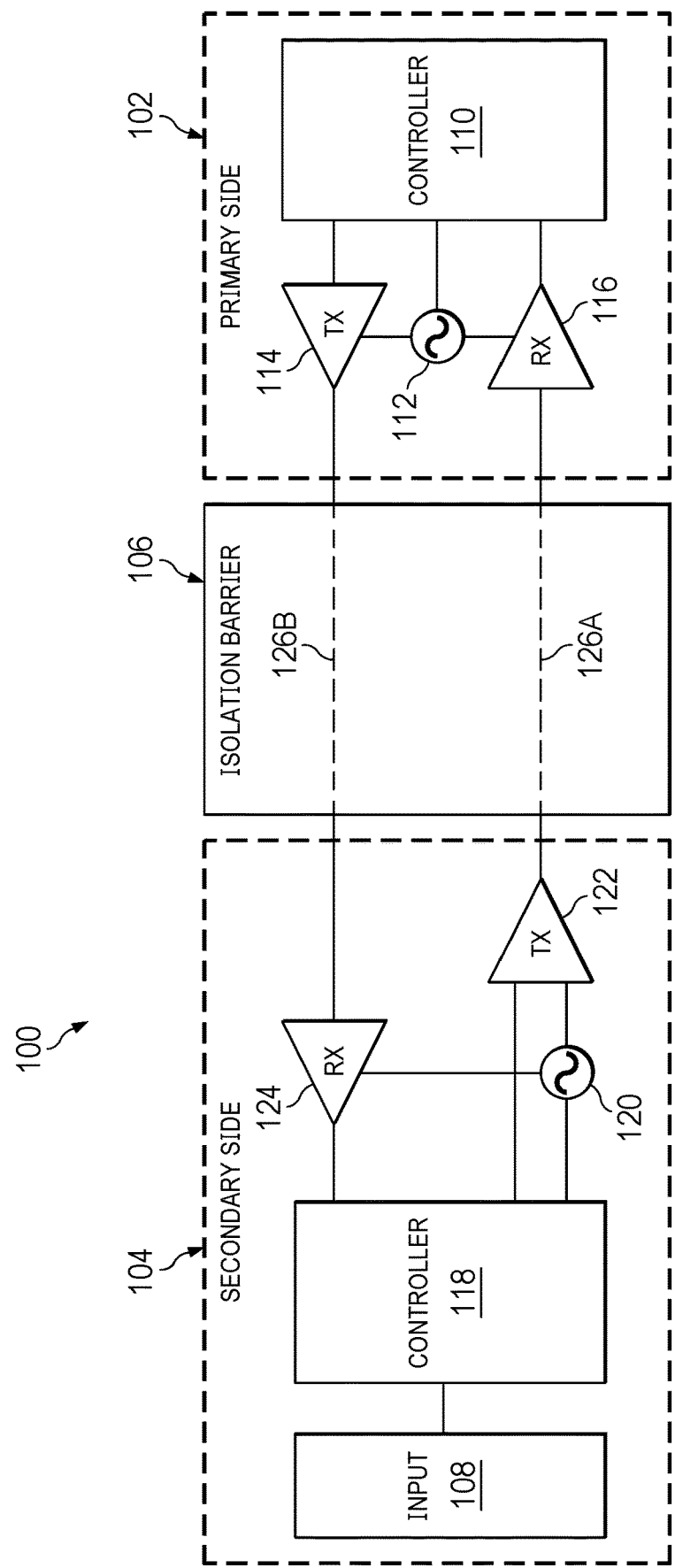
FIG. 1 is a block diagram of a system for oscillator tuning across an isolation barrier in accordance with various examples.

Data channels are useful for transmitting clock and data signals across isolation barriers. To effectively communicate across the isolation barriers, an oscillator on the first side (e.g., a primary side) should be matched in frequency to an oscillator on the second side (e.g., a secondary side). The phases may be matched as well. The oscillators may have frequencies that are slightly unmatched and still be operational in some systems. For example, a biphase mark code may be used. In a biphase mark code, one bit is transmitted for each clock cycle. In addition, at least one transition occurs between each logical 1 or 0 on the channel (e.g., high to low or low to high). This code prevents long strings of only 1's or 0's without any transition, which can make synchronization difficult. The two oscillators may need to be close to synchronized in frequency and/or phase to use biphase mark code. One method for synchronizing oscillators is to trim (e.g., during device fabrication, wafer-level testing, pre-packaging device testing and/or post-packaging device testing) the oscillators using fuses to match the oscillators. One-time programmable (OTP) devices may use fuses that allow the device to be programmed once by trimming. However, OTP circuitry occupies excessive device space, increases cost, and may be used only once for programming the oscillators.

In examples herein, the OTP circuitry may be eliminated on one side of the isolation barrier (such as on the secondary side) and a training sequence may be used to adjust the oscillator on the secondary side. The primary side may send a training sequence to the secondary side, based on the frequency of the oscillator on the primary side. The secondary side tunes the oscillator on the secondary side based on the training sequence. The secondary side then sends a message to the primary side, and if the primary side successfully decodes the message, the primary side determines that the secondary side is successfully trained. At that point, the primary side can send regular data (e.g., a data sequence) to the secondary side. The tuning sequence may be implemented digitally in some examples. The auto-tuning process described herein eliminates OTP for one side of the device, reducing complexity, cost, and device space.

In examples herein, the frequency of the oscillator on the receiving side may be tuned dynamically if the frequency of the primary oscillator changes or is adjusted to a new frequency. The oscillator on the secondary side may be tuned using any suitable technique. For example, the oscillator may be a voltage-controlled oscillator, where the voltage is set by a digital-to-analog converter (DAC). The oscillator frequency may be tuned by changing the DAC code in one example.

The examples herein may be implemented in a variety of systems or products. As one example, an analog front end for electricity meters, circuit breakers, or battery systems may contain any of the examples described herein. Other systems or devices that use bidirectional communication over an isolated barrier may employ the examples described herein. As one example, shunt-based current measurement devices, such as isolated amplifiers, may implement the techniques described herein. In some examples, all (or a portion) of the primary circuitry, secondary circuitry and isolation barrier are implemented on/in an integrated circuit. In other examples, each of the primary circuitry, secondary circuitry and/or the isolation barrier are implemented on/in different integrated circuits.

FIG. 1 is a block diagram of a system 100 for oscillator tuning across an isolation barrier 106 in accordance with various examples herein. System 100 includes a primary side 102, secondary side 104, and isolation barrier 106. Primary side 102 could be a first die, and secondary side 104 could be a second die. Primary side 102 and secondary side 104 could therefore be on separate dies in some examples. Primary side 102 includes a primary controller 110, a primary oscillator 112, a primary transmitter 114, and a primary receiver 116. Secondary side 104 includes an input 108, a secondary controller 118, a secondary oscillator 120, a secondary transmitter 122, and a secondary receiver 124. Communication channels 126A and 126B (collectively, communication channels 126) may be used for communicating across isolation barrier 106.

Even though communication channels 126A and 126B are illustrated as straight lines in FIG. 1, in some examples, isolation barrier 106 includes capacitors, transformers, optocouplers, or other components to isolate primary side 102 from secondary side 104. Isolation channels may include analog circuitry that is capable of communicating signals (e.g., digital signals or modulated signals carrying digital information) across isolation barrier 106 via communication channels 126. More than two communication channels 126 may be present in other examples. In other examples, primary side 102 and/or secondary side 104 may include multiple transmitters and/or receivers, multiple controllers, multiplexers, phase-locked loops, analog to digital converters (ADCs), digital to analog converters (DACs), and any other suitable components.

In an example operation, a training sequence (e.g., a series of signals that includes known quantities, such as known frequencies, magnitudes, phases and/or underlying data) is transmitted from primary transmitter 114 to secondary receiver 124. Secondary side 104 tunes secondary oscillator 120 based on the training sequence. Secondary side 104 then sends data from secondary transmitter 122 to primary receiver 116. If primary side 102 successfully decodes the message, the secondary side 104 is deemed to be successfully trained and primary side 102 begins transmitting regular data (e.g., a data sequence). The frequency of the training sequence is sufficiently different from the frequency of the regular data that the secondary side 104 is able to determine whether the received data is either a training sequence or regular data. In one example, regular data may be transmitted at about 4-8 MHz, while training data is transmitted at about 1 MHz. Other frequencies may be used in other examples. Any suitable circuitry on primary side 102 may be configured to decode the message, such as primary controller 110 or a component of primary receiver 116.

Figure 2:
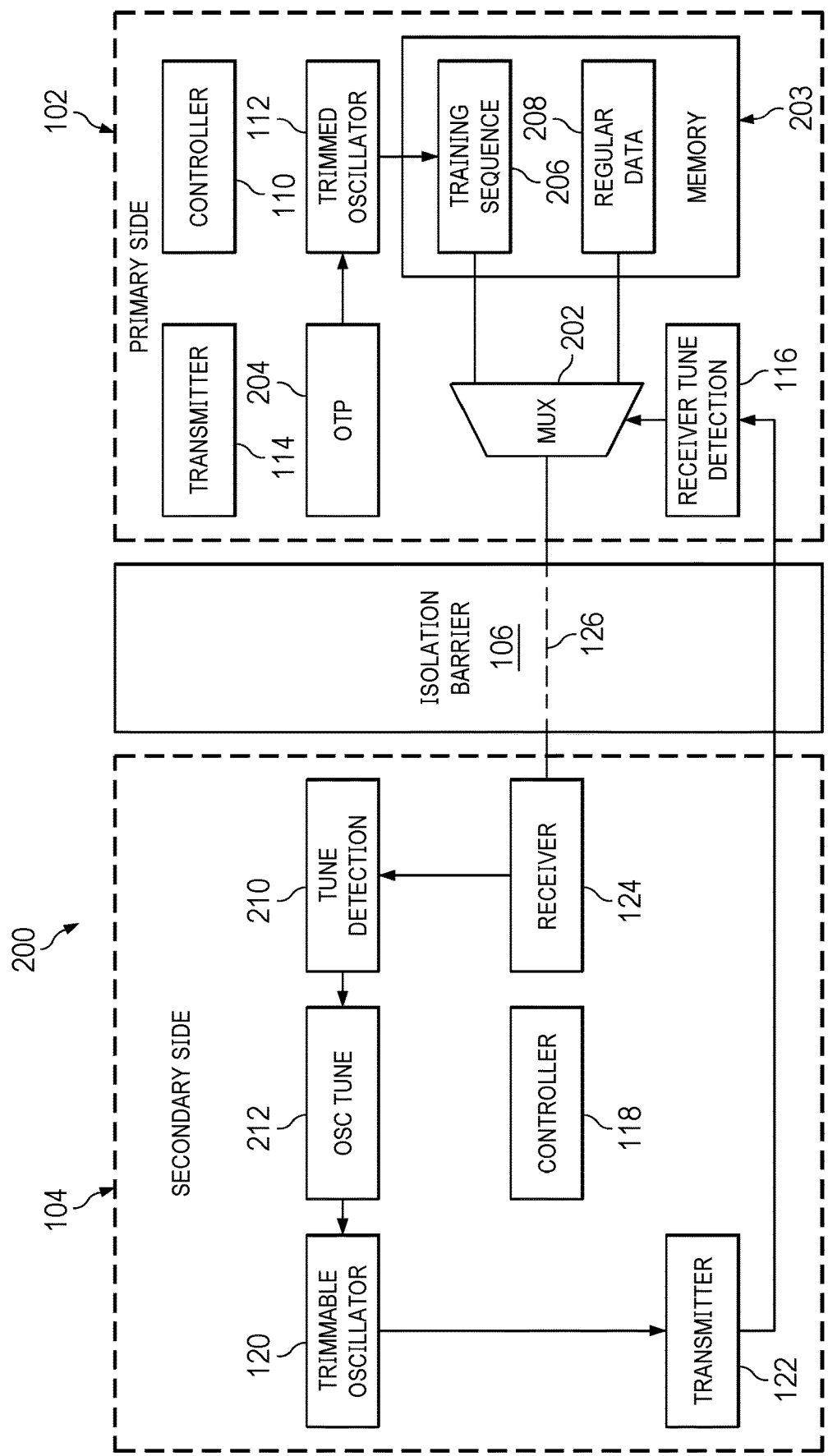
FIG. 2 is a block diagram of a system for oscillator tuning across an isolation barrier in accordance with various examples.

FIG. 2 is a block diagram of a system 200 for oscillator tuning across an isolation barrier in accordance with various examples herein. In system 200, some of the components are described above with respect of FIG. 1, and like numerals denote like components. System 200 includes primary side 102, secondary side 104, and isolation barrier 106. The details of isolation barrier 106 are not shown in FIG. 2 for simplicity, but isolation barrier 106 may be implemented using any type of circuitry isolation (e.g., galvanic isolation) and my include any number of communication channels. In system 200, some components shown on primary side 102 may be located within primary controller 110, and some components shown on secondary side 104 may be located within secondary controller 118. Primary side 102 includes trimmed primary oscillator 112, primary transmitter 114, and primary receiver 116. Primary side 102 includes a multiplexer 202, which may be a component of primary transmitter 114 in one example. Primary side 102 includes a memory 203, OTP 204, a training sequence 206, and regular data 208. Training sequence 206 is any specific pattern of data that is transmitted to secondary side 104 for the purpose of synchronizing secondary oscillator 120. Training sequence 206 may be a data pattern that is transmitted repeatedly at a steady frequency in one example. Multiple training sequences 206 may be stored in memory 203 in some examples. Any suitable training sequence may be used in examples herein. Secondary side 104 may obtain a reference frequency derived from the periodic property of the training sequence 206 and use the reference frequency to synchronize the secondary oscillator 120 in one example. OTP 204 may include any circuitry, hardware, or software for performing one-time programming for trimmed primary oscillator 112. Training sequence 206 and regular data 208 may be stored in memory 203. In another example, training sequence 206 and/or regular data 208 may be stored elsewhere, such as in primary controller 110. System 200 also includes communication channel 126 coupled between multiplexer 202 and secondary receiver 124. Communication channel 126 may be a channel as described above that communicates across isolation barrier 106. More than one communication channel 126 may be present in other examples.

Secondary side 104 includes a secondary controller 118, secondary oscillator 120, a secondary transmitter 122, and a secondary receiver 124. Secondary oscillator 120 may be trimmable or tunable using any suitable trimming or tuning technique, so secondary side 104 can adjust the frequency of secondary oscillator 120 to match the frequency of primary oscillator 112 in response to a training sequence from primary side 102. Secondary side 104 also includes tune detection 210 and oscillator tune 212. Tune detection 210 and oscillator tune 212 may be hardware, software, algorithms executable by secondary controller 118, or digital circuitry on secondary side 104. The operation of tune detection 210 and oscillator tune 212 are described below.

In an example operation, the OTP 204 trims the trimmed primary oscillator 112. Trimmed primary oscillator 112 may be trimmed to any suitable frequency. To tune secondary oscillator 120, a training sequence 206 is transmitted from primary side 102 to secondary side 104. In this example, multiplexer 202 selects a training sequence 206 and then a transmitter transmits the training sequence 206 to secondary receiver 124 on secondary side 104. Multiplexer 202 may select a training sequence 206 if primary controller 110 determines that secondary oscillator 120 is out of tune. In one example, if primary side 102 is unable to decode a transmission from secondary side 104, secondary oscillator 120 may be out of tune.

Secondary side 104 uses training sequence 206 to tune secondary oscillator 120 on secondary side 104. Tuning is performed based on the training sequence 206. As one example, tune detection 210 receives the training sequence 206 via secondary receiver 124 and detects that a training sequence was transmitted to secondary side 104. Tune detection 210 may be hardware or software that analyzes the data received by secondary receiver 124 and determines whether the data contains a training sequence. Tune detection 210 may have stored training sequences to aid in detection of a received training sequence. Tune detection 210 may be performed by secondary controller 118 in some examples. As described above, in one example a training sequence 206 may be detected by tune detection 210 based on the frequency of the received data, where the training sequence 206 has a frequency different than other received data. Responsive to the determination that a training sequence was received by secondary receiver 124, oscillator tune 212 is configured to tune secondary oscillator 120. Oscillator tune 212 may include any hardware or software suitable for tuning secondary oscillator 120. A controller, processor, or digital circuitry may perform tuning in some examples. As one example, the secondary oscillator 120 may be a voltage-controlled oscillator, where the voltage is set by a DAC (not shown in FIG. 2). The oscillator frequency may be tuned by changing the DAC code in one example. In other examples, other methods may be used to tune the secondary oscillator 120, such as a resistor network or other analog circuitry. The frequency of secondary oscillator 120 may be systematically increased or decreased via tuning until the frequency of secondary oscillator 120 matches the frequency of the training sequence 206. In some examples, the frequency of secondary oscillator 120 may be tuned until it is within a specific frequency range above or below the nominal frequency of primary oscillator 112, such as within 5% or 10% of the nominal frequency.

After secondary oscillator 120 is tuned to the appropriate frequency, primary side 102 is notified that training is complete. In this example, secondary transmitter 122 transmits a message to primary receiver 116 indicating that training of secondary oscillator 120 is complete. If primary side 102 successfully decodes the message, then the primary side 102 confirms that the training is complete. A success message may be provided from primary receiver 116 to multiplexer 202 or primary controller 110 that the message from secondary side 104 was successfully decoded. Multiplexer 202 on primary side 102 can then switch to transmitting regular data 208 (which may or may not be stored in memory—in some examples, regular data 208 does not pass through memory and/or may come from an external device) between primary side 102 and secondary side 104. If the training process was unsuccessful, primary side 102 may have been unable to decode the message from secondary side 104 at primary receiver 116. In that instance, primary side 102 could then initiate another training sequence 206, and continue initiating training sequences 206 until training is successful.

In one example, secondary side 104 differentiates regular data 208 from training sequence 206 by the frequency of the signal received at secondary receiver 124. The regular data 208 could have a frequency of around 4-8 MHz in one example, while the training sequence 206 has a frequency of around 1 MHz. These frequencies could vary in other examples, as long as the difference between the frequencies of the two types of data is large enough for secondary receiver 124 to differentiate between the two signals.

The primary side 102 can send a training sequence 206 to secondary receiver 124 any time the two sides are out of tune. Primary side 102 can determine that the sides are out of tune if primary side 102 is unable to decode the data it receives from secondary side 104. The two sides may go out of tune for a variety of reasons, such as aging devices, a device restart, a power outage, etc. Primary side 102 may then send a training sequence 206 to bring the oscillators (112, 120) on each side back in tune.

Figure 3:
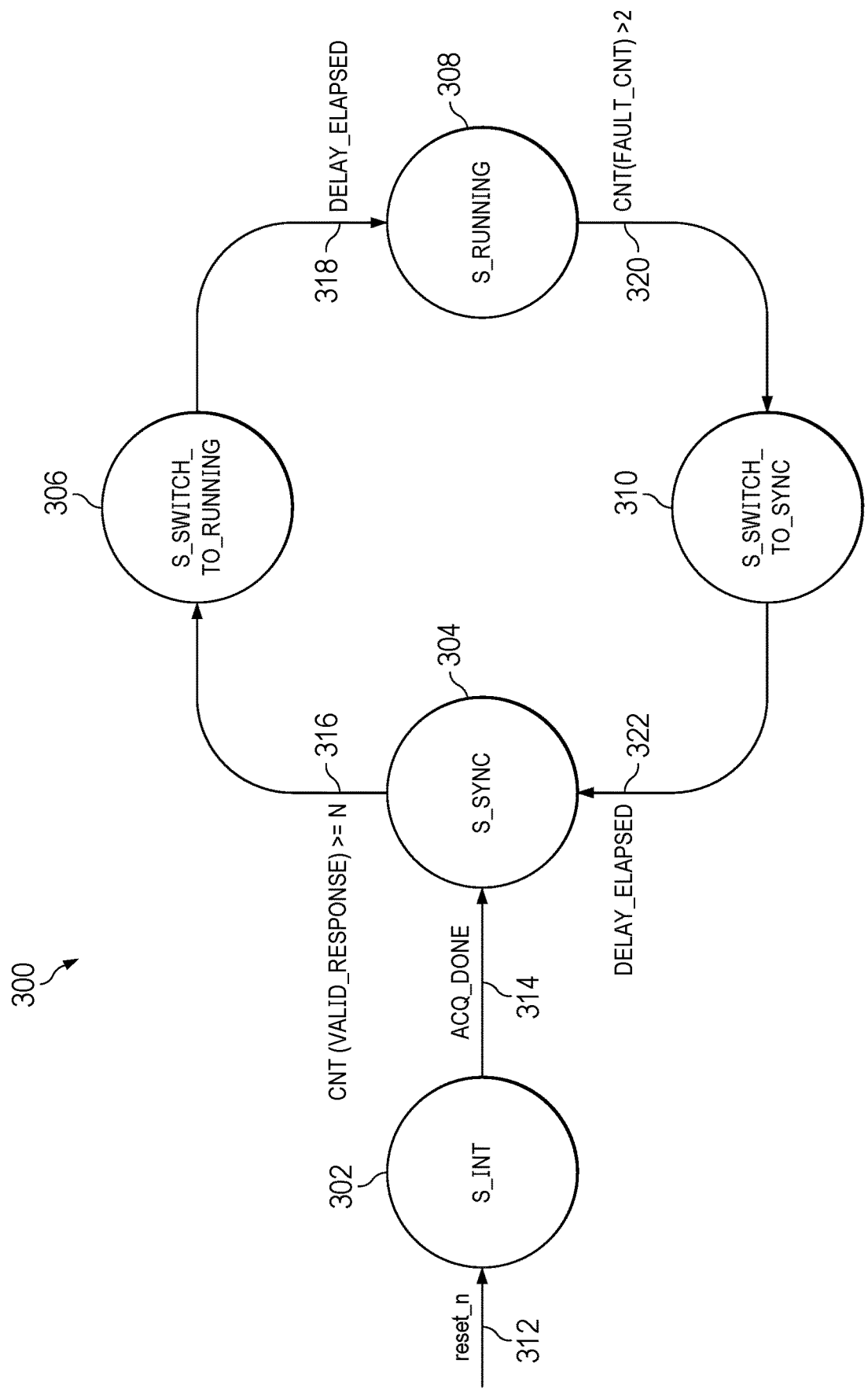
FIG. 3 is a diagram of a state machine for a transmitter side in accordance with various examples.

FIG. 3 is a diagram of a state machine 300 for a transmitter side, such as primary side 102, in accordance with one example herein. The states described herein are one example, and in other examples different states may be used to perform the operations herein. The states may also have a different order in other examples. The actions of state machine 300 may be performed by the hardware (e.g., primary controller 110, secondary controller 118 and/or other circuitry on primary side 102) described above with respect to FIGS. 1 and 2. State machine 300 includes states 302, 304, 306, 308, and 310. The state machine 300 initializes at state 302 (S_INIT) in response to receiving a reset signal 312 (reset_n) as shown. Then an acquisition may be performed (ACQ_DONE 314), and state machine 300 moves to state 304 (S_SYNC) to perform synchronization. At state 304, a sufficient amount of time should elapse between the last synchronization packet (e.g., training message) received from secondary transmitter 122 and the first regular data packet from secondary transmitter 122, so primary side 102 does not recognize the data packet as another synchronization process. Therefore, the state machine 300 moves to a wait state 306 (S_SWITCH_TO_RUNNING). An example method for waiting a sufficient amount of time is to use a count, such as cnt(valid_response)>=N (count 316). The wait state may be a constant delay in some examples.

After the requisite amount of delay has elapsed (DELAY_ELAPSED 318), state machine 300 moves to state 308. State 308 is a running state (S_RUNNING). In state 308, multiplexer 202 switches to regular data 208, to end the training sequence and begin transmitting regular data 208 to secondary side 104.

During the running state 308, primary side 102 counts the number of faults in the data received from secondary side 104. As shown, if cnt(fault_cnt) 320 is greater than a predetermined value, such as 2, then a synchronization operation should be performed again to synchronize secondary side 104 with primary side 102. If the count of errors is greater than the predetermined number, the state machine 300 moves to state 310 (S_SWITCH_TO_SYNC) to switch to a synchronization operation. After a predetermined delay (DELAY_ELAPSED 322), state machine 300 moves to state 304 to perform another synchronization operation. State machine 300 may then continue operation as described above.

Figure 4:
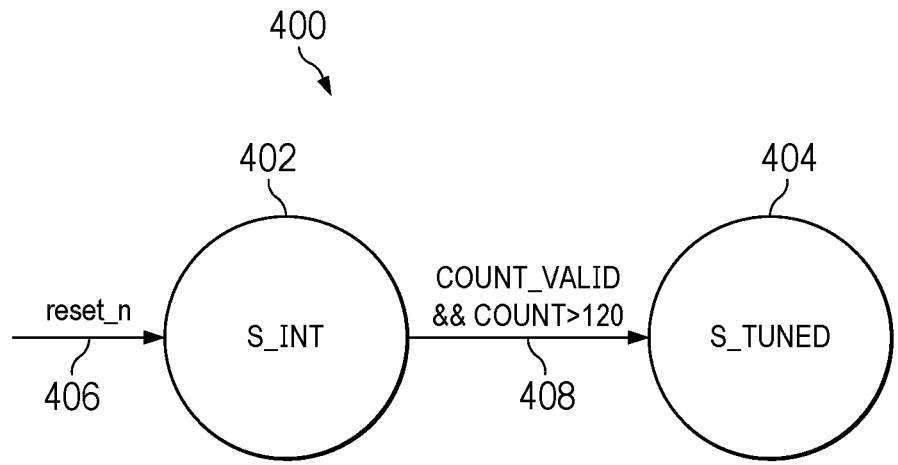
FIG. 4 is a diagram of a state machine for a receiver side in accordance with various examples.

FIG. 4 is a diagram of a state machine 400 for a receiver side, such as secondary side 104, in accordance with one example herein. The states described herein are one example, and in other examples different states may be used to perform the operations herein. The states may also have a different order in other examples. The actions of state machine 400 may be performed by the hardware (e.g., secondary controller 118 and/or other circuitry on secondary side 104) described above with respect to FIGS. 1 and 2. State machine 400 includes states 402 and 404. The state machine 400 initializes at state 402 (S_INIT), and may be initialized with a reset signal 406 (reset_n) as shown.

A count may be implemented of the data from primary side 102 to secondary side 104. If the data is received as expected, the count 408 (count_valid && count>120) indicates that the oscillator on secondary side 104 is in tune, and the state machine moves to state 404 (S_TUNED). While in the tuned state 404, secondary side 104 continues to listen for the training sequence 206 from primary side 102. If the training sequence 206 is received, the secondary side 104 performs tuning of secondary oscillator 120 as described above.

Figure 5:
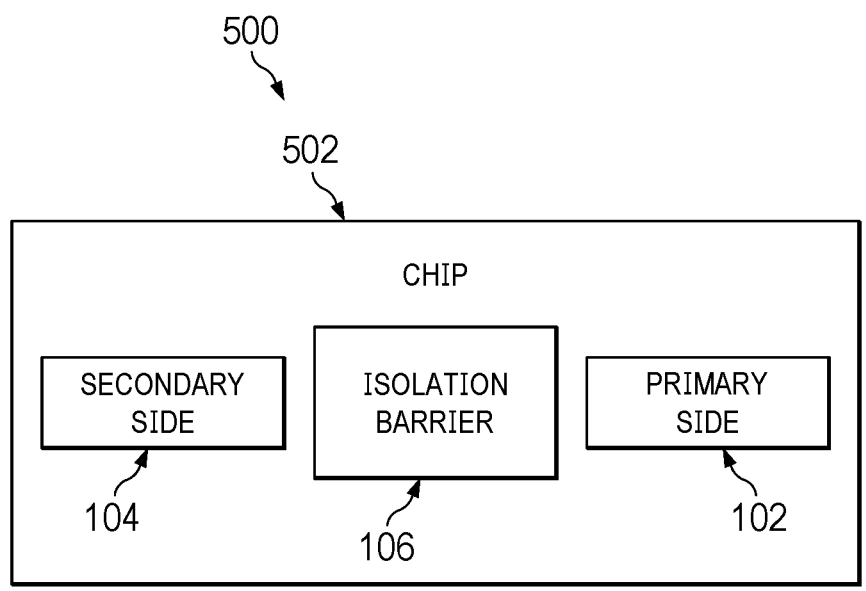
FIG. 5 is block diagram of a system for a clock matching tune circuit in accordance with various examples.

FIG. 5 is a block diagram of a system 500 for a clock matching tune circuit in accordance with various examples herein. System 500 includes a chip 502. In this example, chip 502 includes a primary side 102, a secondary side 104, and an isolation barrier 106. The primary side 102 and secondary side 104 may include some or all of the components described above with respect to FIGS. 1 and 2. Other components may be included in other examples. Primary side 102 may include a primary oscillator and secondary side may include a secondary oscillator. As described herein, the OTP circuitry may be eliminated on the secondary side and a training sequence used to adjust the oscillator on the secondary side. The primary side may send a training sequence to the secondary side, based on the frequency of the oscillator on the primary side. The secondary side then tunes the oscillator on the secondary side based on the training sequence.

Figure 6:
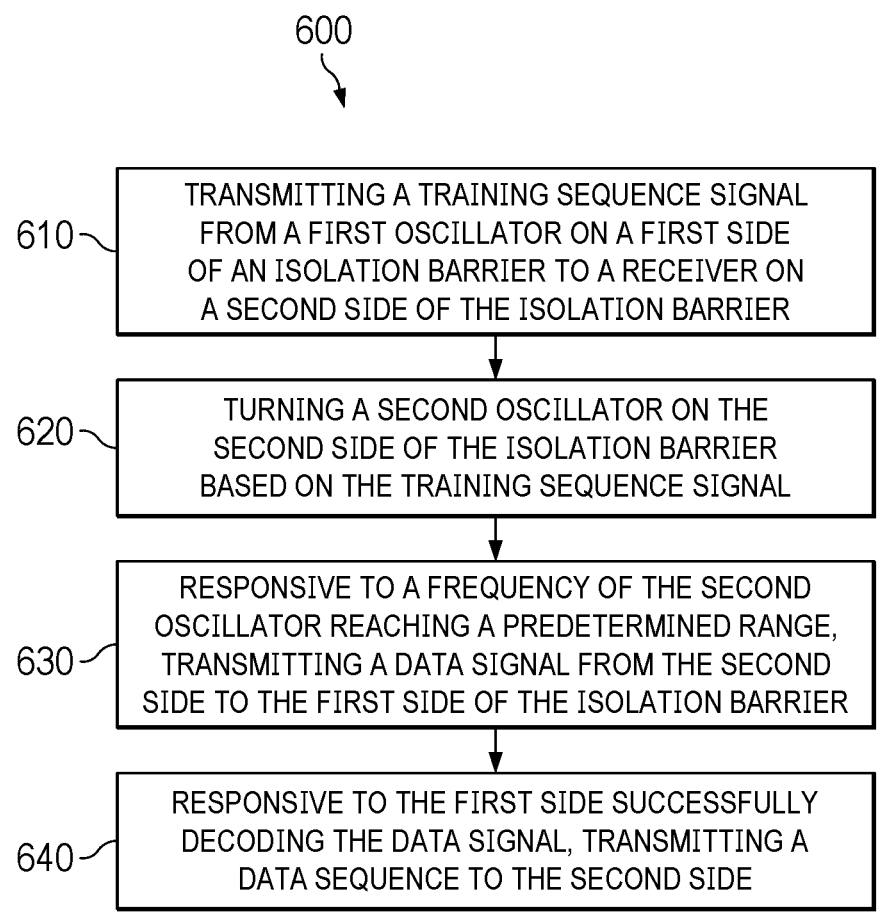
FIG. 6 is a flow diagram of a method for tuning an oscillator across an isolation barrier in accordance with various examples.

FIG. 6 is a flow diagram of a method 600 for tuning an oscillator across an isolation barrier according to various examples herein. The steps of method 600 may be performed in any suitable order. The hardware components described above with respect to FIGS. 1, 2, and 5 may perform method 600 in some examples. Any suitable hardware or digital logic may perform method 600 in some examples.

Method 600 begins at 610, where a transmitter transmits a training sequence signal from a first oscillator on a first side of an isolation barrier to a receiver on a second side of the isolation barrier. The training sequence signal may be any suitable training signal at any suitable frequency. The training sequence signal may be sent responsive to the first side unable to decode a message from the second side. The training signal may include any type of signal (e.g. a fixed frequency or variable frequency) modulated (e.g., using any type of modulation scheme, such as on-off keying) by digital data (or no data). The carrier frequency for the training signal should be appreciably different than the carrier frequency used to transmit/receive data during normal operation.

Method 600 continues at 620, where tuning circuitry tunes a second oscillator on the second side of the isolation barrier based on the training sequence. The second oscillator may be tuned using any suitable technique.

Method 600 continues at 630, where responsive to a frequency of the second oscillator reaching a predetermined range, a transmitter transmits a data signal from the second side to the first side of the isolation barrier. The data signal may be any signal that indicates to the first side that the second oscillator has been tuned to an acceptable range.

Method 600 continues at 640, where responsive to the first side successfully decoding the data signal, a transmitter transmits a data sequence to the second side. If the first side is able to successfully decode the signal, the second oscillator has been successfully tuned, and normal data transmission between the first side and the second side may resume. In some examples, the signal is decoded "n" consecutive times to validate the training sequence.

Figure 7:
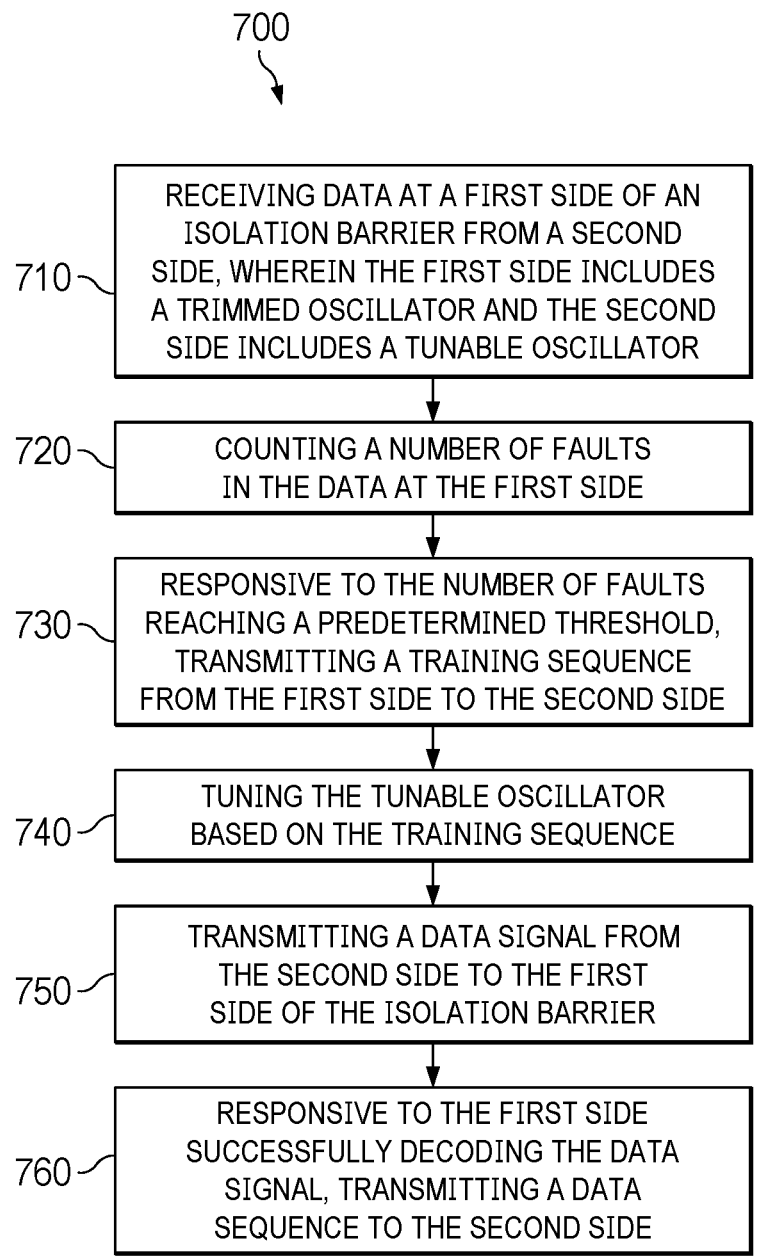
FIG. 7 is a flow diagram of a method for tuning an oscillator across an isolation barrier in accordance with various examples.

FIG. 7 is a flow diagram of a method 700 for tuning an oscillator across an isolation barrier according to various examples herein. The steps of method 700 may be performed in any suitable order. The hardware components described above with respect to FIGS. 1, 2, and 5 may perform method 700 in some examples. Any suitable hardware or digital logic may perform method 700 in some examples.

Method 700 begins at 710, where a receiver receives data (e.g., during normal operation) at a first side of an isolation barrier from a second side, where the first side includes a trimmed oscillator and the second side includes a tunable oscillator.

Method 700 continues at 720, where a controller or other hardware counts a number of faults in the data at the first side. If a certain number of faults occur in the data, the tunable oscillator on the second side may be out of tune with the trimmed oscillator on the first side.

Method 700 continues at 730, where responsive to the number of faults reaching a predetermined threshold, a transmitter transmits a training sequence from the first side to the second side. If the number of faults reaches the predetermined threshold, the first side determines that the tunable oscillator is out of tune, and initiates the training sequence to get the tunable oscillator back into tune.

Method 700 continues at 740, where the tunable oscillator is tuned based on the training sequence. Any suitable hardware, software, or digital logic may be used for tuning the tunable oscillator. The tunable oscillator is tuned until it reaches an acceptable frequency or it reaches an acceptable frequency range, where the acceptable frequency or frequency range is based on the frequency of the trimmed oscillator on the first side.

Method 700 continues at 750, where a transmitter transmits a data signal from the second side to the first side of the isolation barrier. The signal indicates that the oscillator on the second side is tuned, and that regular data transmission can resume.

Method 700 continues at 760, where responsive to the first side successfully decoding the data signal, a transmitter transmits a data sequence to the second side. If the first side successfully decodes the data signal, the oscillators are in tune. If the first side cannot successfully decode the data signal, the first side can initiate another training sequence to send to the second side.

The auto-tuning process described herein eliminates OTP for one side of the device, reducing complexity, cost, and device space. Testing may also be reduced because OTP is only performed for one oscillator instead of two. The overhead for OTP is eliminated on one side, such as fuses, possible increased supply voltage, and monitor circuitry that monitors whether the fuses are blown. In examples herein, the frequency of the oscillator on the receiving side may be tuned dynamically if the frequency of the primary oscillator changes or is adjusted to a new frequency. Dynamic tuning may not be possible if OTP is used for both oscillators.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means +/−10 percent of the stated value, or, if the value is zero, a reasonable range of values around zero. Modifications are possible in the described examples, and other examples are possible within the scope of the claims.

What is claimed is:

1. A method, comprising:
receiving a training sequence signal from a first oscillator on a first side of an isolation barrier to a receiver on a second side of the isolation barrier;
tuning a second oscillator on the second side of the isolation barrier based on the training sequence signal;
responsive to a frequency of the second oscillator reaching a predetermined range, transmitting a data signal from the second side to the first side of the isolation barrier;
responsive to the first side successfully decoding the data signal, transmitting a data sequence to the second side; and
responsive to the first side successfully decoding the data signal, providing a success message to a multiplexer.

2. The method of claim 1, further comprising:
tuning the first oscillator with one-time programmable circuitry.

3. The method of claim 1, further comprising:
selecting the training sequence signal with the multiplexer.

4. The method of claim 1, further comprising:
detecting the training sequence signal on the second side of the isolation barrier based on the frequency of the training sequence signal.

5. The method of claim 1, further comprising:
selecting the data sequence with the multiplexer.

6. The method of claim 1, wherein the training sequence signal has a different frequency than the data sequence.

7. A system having circuitry on a first side of an isolation barrier and circuitry on a second side of the isolation barrier, the system comprising:
the isolation barrier operable to electrically isolate the first side from the second side;
a trimmed oscillator, a first transmitter, and a first receiver on the first side, the trimmed oscillator coupled to the first transmitter;
a tunable oscillator, a second transmitter, and a second receiver on the second side, the tunable oscillator coupled to the second receiver and the second transmitter;
wherein the first side is configured to transmit a training sequence to the second side, and the second side is configured to tune the tunable oscillator based on the training sequence; and
wherein the first side is configured to count a number of faults from the second side.

8. The system of claim 7, further comprising:
a multiplexer on the first side, wherein the multiplexer is configured to select between the training sequence and a data sequence.

9. The system of claim 7, wherein the first receiver is configured to decode a message from the second side.

10. The system of claim 7, wherein the second receiver is configured to detect the training sequence from the first side.

11. The system of claim 10, wherein the second receiver is configured to detect the training sequence based on a frequency of the training sequence.

12. The system of claim 7, wherein the first side and the second side are on separate dies.

13. The system of claim 7, wherein the first side is configured to transmit the training sequence responsive to the number of faults from the second side.

14. A method of operating a system having circuitry on a first side of an isolation barrier and circuitry on a second side of the isolation barrier, the method comprising:
receiving data at the first side from the second side, wherein the first side includes a trimmed oscillator and the second side includes a tunable oscillator;
counting a number of faults in the data at the first side;
responsive to the number of faults reaching a predetermined threshold, transmitting a training sequence from the first side to the second side;
tuning the tunable oscillator based on the training sequence;
transmitting a data signal from the second side to the first side of the isolation barrier; and
responsive to the first side successfully decoding the data signal, transmitting a data sequence to the second side.

15. The method of claim 14, further comprising:
responsive to the first side unsuccessfully decoding the data signal, transmitting another training sequence to the second side.

16. The method of claim 14, wherein a frequency of the training sequence is different than a frequency of the data sequence.

17. The method of claim 14, wherein responsive to the first side successfully decoding the data signal, providing a success message to a multiplexer.

18. The method of claim 14, wherein the trimmed oscillator is trimmed using one-time programmable circuitry.

* * * * *